(12) United States Patent
Wachi

(10) Patent No.: US 7,932,973 B2
(45) Date of Patent: Apr. 26, 2011

(54) ELECTRO-OPTICAL DEVICE HAVING A COLOR FILTER HAVING COLOR LAYERS WITH DIFFERENT HUES

(75) Inventor: Reiko Wachi, Tottori (JP)

(73) Assignee: Sony Corporation, Tokyo (JP)

( * ) Notice: Subject to any disclaimer, the term of this patent is extended or adjusted under 35 U.S.C. 154(b) by 546 days.

(21) Appl. No.: 11/746,114

(22) Filed: May 9, 2007

(65) Prior Publication Data

US 2007/0279557 A1 Dec. 6, 2007

(30) Foreign Application Priority Data

May 30, 2006 (JP) ................................. 2006-149321

(51) Int. Cl.
  *G02F 1/1335* (2006.01)
(52) U.S. Cl. ......... 349/108; 349/107; 349/109; 349/114
(58) Field of Classification Search .......................... None
  See application file for complete search history.

(56) References Cited

U.S. PATENT DOCUMENTS

| 6,724,446 | B2 | 4/2004 | Motomura et al. |
| 7,304,700 | B2 | 12/2007 | Park et al. |
| 2003/0086037 | A1* | 5/2003 | Sekiguchi ..................... 349/113 |
| 2004/0135945 | A1* | 7/2004 | Choi et al. ..................... 349/114 |
| 2005/0237450 | A1* | 10/2005 | Hu et al. ....................... 349/108 |
| 2008/0124997 | A1 | 5/2008 | Park et al. |

FOREIGN PATENT DOCUMENTS

| CN | 1624544 | 6/2005 |
| JP | 2002-228824 | 8/2002 |
| JP | 2002-303864 | 10/2002 |
| JP | 2003-177410 | 6/2003 |
| JP | 2004-191646 | 7/2004 |
| JP | 2005-025002 | 1/2005 |
| JP | 2005-275113 | 10/2005 |

OTHER PUBLICATIONS

Machine translation of JP 2004-191646.*
Machine translation of JP 2005-275113.*
Machine translation of Japanese Patent Document 2005-25002, made of record by the applicant.*

* cited by examiner

*Primary Examiner* — Mark A Robinson
*Assistant Examiner* — Michael P Mooney
(74) *Attorney, Agent, or Firm* — K&L Gates LLP

(57) ABSTRACT

An electro-optical device includes a plurality of subpixel regions forming a display field and a color filter including a plurality of color layers of which at least one is of an additive primary color. The color layers have different color hues and at least two of the color layers are arranged in at least one of the subpixel regions so as not to overlap with each other in plan view. A method for manufacturing the electro-optical device includes forming the color layers such that at least two of the color layers are arranged in at least one of the subpixel regions so as not to overlap with each other in plan view. An electronic apparatus includes the electro-optical device.

5 Claims, 20 Drawing Sheets

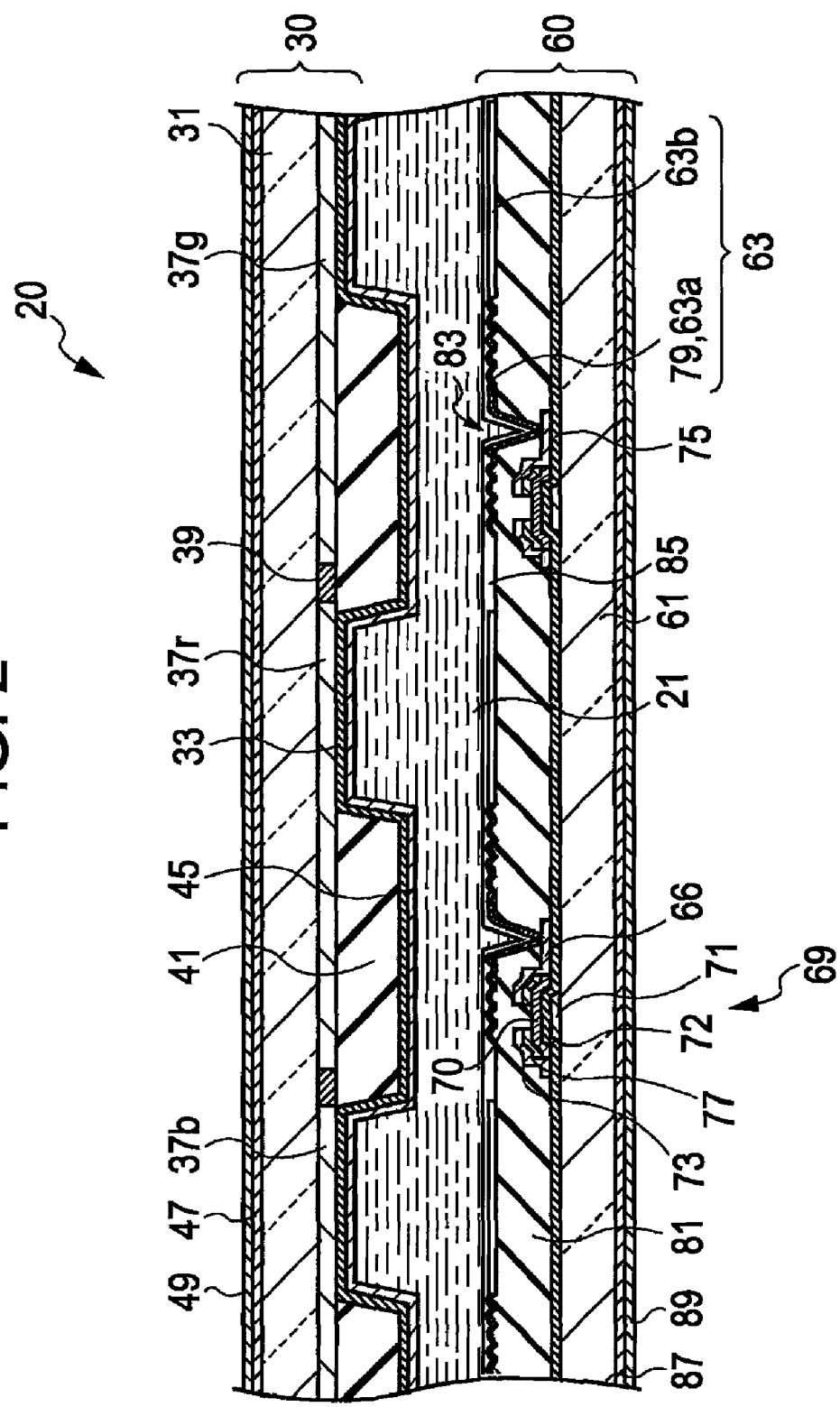

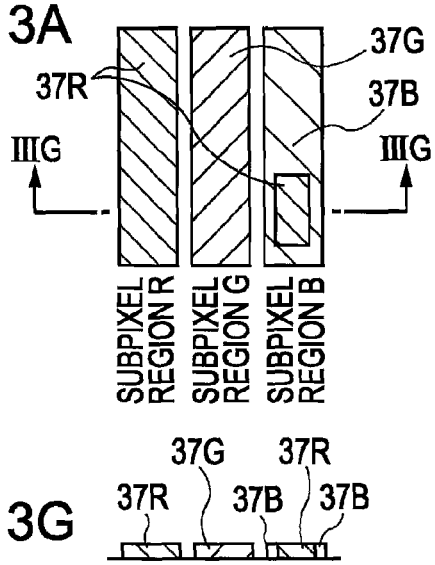
FIG. 3A
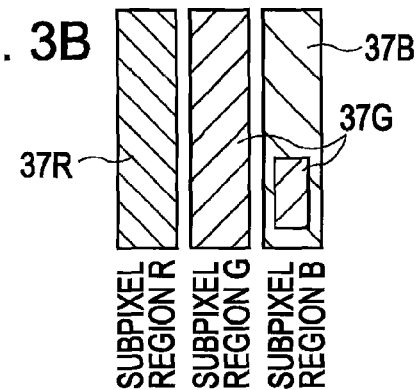
FIG. 3B
FIG. 3G
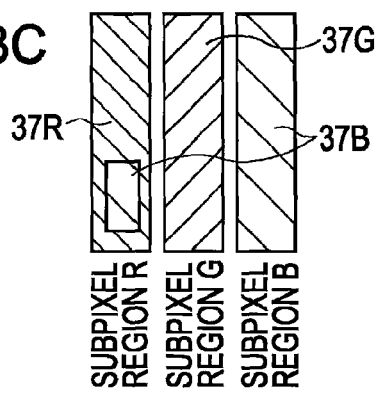
FIG. 3C
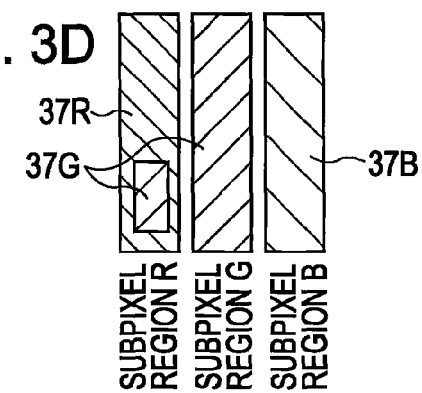
FIG. 3D
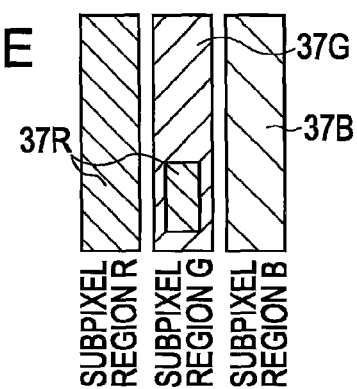
FIG. 3E
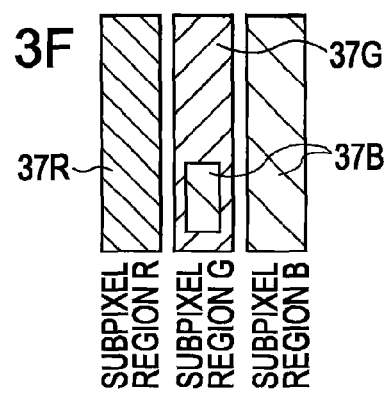
FIG. 3F

TRANSMISSIVE SECTION

REFLECTIVE SECTION

ELECTRO-OPTICAL DEVICE HAVING A COLOR FILTER HAVING COLOR LAYERS WITH DIFFERENT HUES

The entire disclosure of Japanese Patent Application No. 2006-149321, filed May 30, 2006 is expressly incorporated by reference herein.

BACKGROUND

1. Technical Field

The present invention relates to electro-optical devices, methods for manufacturing such electro-optical devices, and electronic apparatuses. The present invention particularly relates to an electro-optical device including a color filter including color layers of additive primary colors, a method for manufacturing such an electro-optical device, an electronic apparatus including such an electro-optical device.

2. Related Art

Liquid crystal displays are examples of known electro-optical devices for displaying images. The liquid crystal displays each include a plurality of subpixel regions opposed to electrodes. In the liquid crystal displays, light passing through liquid crystal materials present in the subpixel regions is modulated in such a manner that the subpixel regions are turned on or off by selectively applying voltages to the electrodes, whereby pictures or characters are displayed.

The liquid crystal displays include color filters for coloring light so as to display color images. The color filters include color layers of the three additive primary colors: red (R), green (G), and blue (B). Various colors are reproduced by controlling the magnitude of the voltage applied to each subpixel region or controlling the balance between the three additive primary colors.

The color filters include the color layers of the three additive primary colors as described above. Since a desired color depends on functions or uses of the liquid crystal displays, color resists for forming the color layers need to be prepared for each function or use thereof.

For a transflective liquid crystal display for displaying an image in a reflective or transflective mode, in order to eliminate the difference in brightness between light beams that pass through color layers disposed in reflective or transmissive regions having different optical path lengths, different color resists are used to form subpixel regions of the same color in some cases.

JP-A-2005-25002 (hereinafter referred to as Patent Document 1) discloses a color liquid crystal display that includes a minimized number of color filters for the sake of reducing costs such as development cost. The color liquid crystal display includes pixels that each have a reflective section including a reflective layer and also each have a transmissive section including no reflective layer. The pixels correspond to a plurality of primary colors. With reference to FIGS. 22A, 22B, and 22C, some of the pixels that correspond to at least one of the primary colors each have a dark color filter portion A covering a portion of the reflective section and a portion of the transmissive section and also each have a light color filter portion B covering a remaining portion of the reflective section and a remaining portion of the transmissive section.

In the color liquid crystal display described in Patent Document 1, a deep color filter and a light color filter are used for one of the primary colors; hence, at least four color resists need to be prepared. If dark color filters and light color filters are used for all of the primary colors, at least six color resists need to be prepared. The number of kinds of color resists that need to be prepared is greater than the number of the primary colors. Therefore, the color liquid crystal display is disadvantageous in cost. An increase in the number of kinds of color resists increases the number of steps of forming the color layers. This leads to a reduction in manufacturing efficiency.

In the color liquid crystal display, the color of each subpixel region cannot be varied although the reflective section and the transmissive section can be varied in color density; hence, the reflective section and the transmissive section cannot be individually adjusted to a desired color.

SUMMARY

The present inventors have made intensive studies to find that the following device is effective in solving the above problems: an electro-optical device including a color filter including a plurality of color layers of additive primary colors. In the electro-optical device, at least two of the color layers are arranged in at least one of subpixel regions so as not to overlap with each other in plan view.

An advantage of an aspect of the invention is to provide an electro-optical device in which the color of each subpixel region can be adjusted without preparing an additional color resist other than color resists of additive primary colors and which is capable of reproducing a delicate color tone without causing an increase in manufacturing cost or a reduction in manufacturing efficiency. An advantage of another aspect of the invention is to provide a method for manufacturing such an electro-optical device. An advantage of another aspect of the invention is to provide an electronic apparatus including such an electro-optical device.

An electro-optical device according to the present invention includes a plurality of subpixel regions forming a display field and a color filter including a plurality of color layers of which at least one is of an additive primary color. The color layers have different color hues and at least two of the color layers are arranged in at least one of the subpixel regions so as not to overlap with each other in plan view.

Since at least two of the color layers are arranged in at least one of the subpixel regions so as not to overlap with each other in plan view, the color hues of the subpixel regions can be adjusted without using an additional color resists. This allows subpixel regions having another color hue to be formed and allows the reflective section and the transmissive section to have different color hues without causing an increase in manufacturing cost or an increase in the number of manufacturing steps. Therefore, the electro-optical device can be efficiently manufactured. The electro-optical device can reproduce desired colors and can display an image with high color reproducibility.

In the electro-optical device, at least one of the subpixel regions preferably has a reflective section and a transmissive section and at least two of the color layers are preferably arranged in the reflective section. This allows the color hue of the reflective section to be adjusted without using an additional color resist and allows the color filter to have color hues suitable for various display modes.

In the electro-optical device, two or more of the color layers are preferably uniformly distributed in at least one of the subpixel regions. This prevents color unevenness from occurring in the subpixel region having two or more of the color layers.

In the electro-optical device, at least one of the subpixel regions that includes at least two of the color layers and the subpixel regions each including one of the color layers preferably form each pixel. This allows the pixel to include one or more of the subpixel regions, made of two of a red, a green, and a blue color resist, each having a yellow, a magenta, or a cyan hue in addition to the subpixel regions each having a red, green, or blue hue even if an additional color resist is not used. Therefore, the color reproducibility of a displayed image can be enhanced.

In the electro-optical device, at least one of the subpixel regions preferably has a reflective section and a transmissive section and the total thickness of each color layer in the reflective section is preferably less than the total thickness of the color layer in the transmissive section. This allows the color density of the reflective section and that of the transmissive section to agree with each other even if the color hue of the subpixel region having the reflective section and the transmissive section is uniformly varied.

In the electro-optical device, at least one of the subpixel regions preferably has an uncolored zone. This allows the difference in color density between the reflective section and the transmissive section to be readily adjusted and allows the difference in color density between a red, a green, and a blue hue.

The present invention provides a method for manufacturing an electro-optical device including a plurality of subpixel regions forming a display field and a color filter including a plurality of color layers of which at least one is of an additive primary color and which have different color hues. The method includes forming the color layers such that at least two of the color layers are arranged in at least one of the subpixel regions so as not to overlap with each other in plan view.

The subpixel regions can be formed so as to have a color hue different from the color hues of color resists of primary colors without using an additional color resist in such a manner that the arrangement of the color layers having different color hues in at least one of the subpixel regions is adjusted. Therefore, the color hue of the subpixel region having the color layers can be adjusted without causing an increase in manufacturing cost or an increase in the number of manufacturing steps. That is, the electro-optical device can be efficiently manufactured so as to display an image with high color reproducibility.

Furthermore, the present invention provides an electronic apparatus including any one of the above electro-optical devices. In the electro-optical devices, the color hues of the subpixel regions are adjusted without causing an increase in manufacturing cost or an increase in the number of manufacturing steps. The electronic apparatus can be efficiently manufactured so as to display an image with high color reproducibility.

BRIEF DESCRIPTION OF THE DRAWINGS

The invention will be described with reference to the accompanying drawings, wherein like numbers reference like elements.

FIG. 2 is an enlarged sectional view of a liquid crystal display panel included in the electro-optical device of the first embodiment.

FIGS. 3A to 3F are plan views of pixels each including three subpixel regions including color layers having different color hues and FIG. 3G is a sectional view of the pixel taken along the line IIIG-IIIG of FIG. 3A.

DESCRIPTION OF EXEMPLARY EMBODIMENTS

Figure 1A:
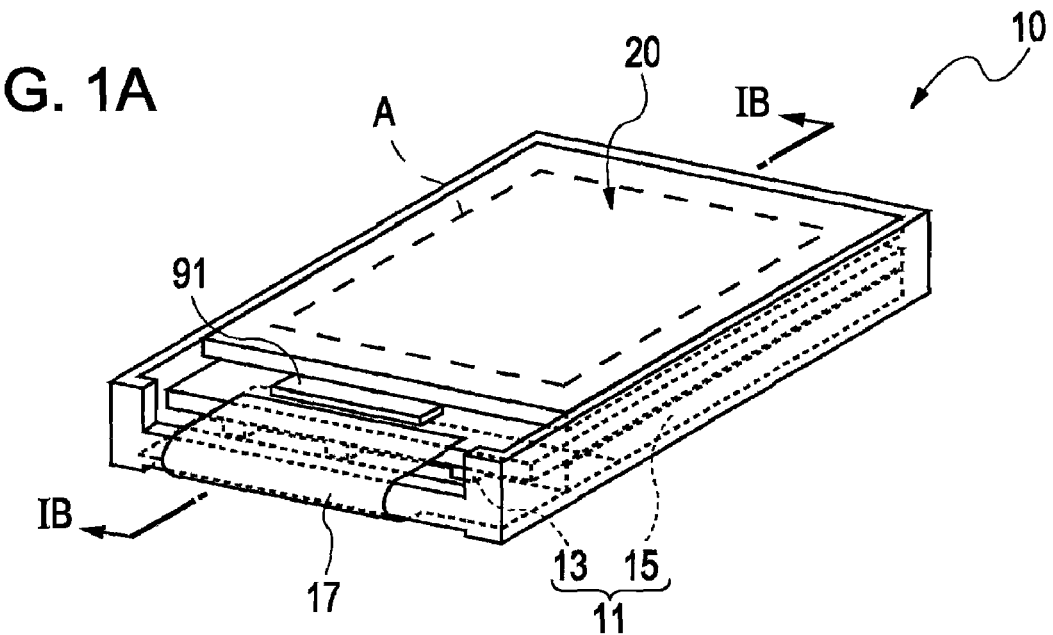
FIG. 1A is a schematic perspective view of an electro-optical device according to a first embodiment of the present invention and FIG. 1B is a sectional view of the electro-optical device taken along the line IB-IB of FIG. 1A.

Embodiments of the present invention will now be described in detail with reference to the accompanying drawings. The embodiments are for exemplification only and are not intended to limit the invention. Various modifications may be made to the embodiments within the scope of the present invention.

In the accompanying drawings, members having the same reference numeral are substantially the same and will not be described in detail.

First Embodiment

A first embodiment provides an Electro-optical device, which may be a liquid crystal display that includes a plurality of subpixel regions for forming a display field and also includes a color filter including a plurality of color layers of which at least one is of an additive primary color.

The liquid crystal display is characterized in that the color filter includes the color layers having different color hues and at least two of the color layers are arranged in at least one of subpixel regions so as not to overlap with each other in plan view.

The electro-optical device will now be described with reference to FIGS. 1 to 10. The electro-optical device is not limited to an active matrix liquid crystal display including thin-film transistors (TFTs) and may be a liquid crystal display, such as a liquid crystal display including thin-film diodes (TFDs) or a passive matrix liquid crystal display, including a color filter.

1. Configuration of Electro-optical Device

Figure 1B:
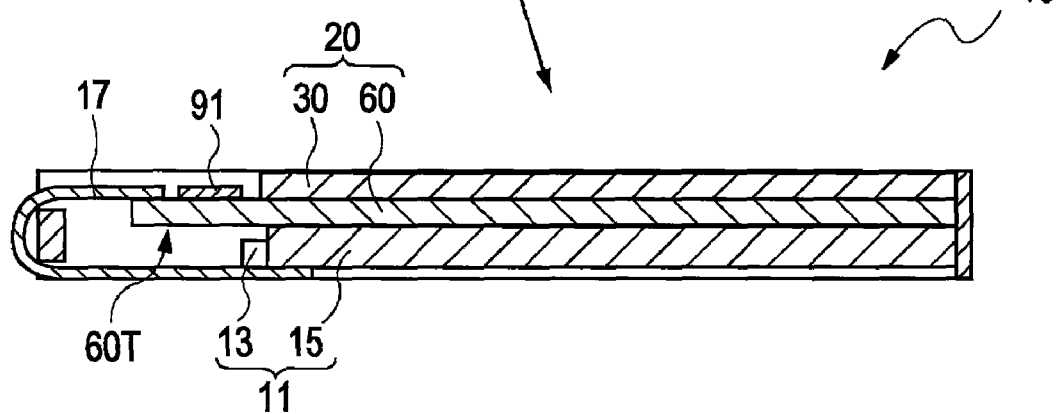

The configuration of the electro-optical device will now be described with reference to FIGS. 1A and 1B. FIG. 1A shows the electro-optical device in perspective view. FIG. 1B shows the electro-optical device in sectional view taken along the line IB-IB of FIG. 1A.

With reference to FIGS. 1A and 1B, the electro-optical device is represented by reference numeral 10 and includes a liquid crystal display panel 20. The liquid crystal display panel 20 includes an element substrate 60, a counter substrate 30 bonded thereto with a sealing member (not shown), and a liquid crystal material 21 (not shown) sealed between the element substrate 60 and the counter substrate 30. The element substrate 60 has a protruding portion 60T extending outside the counter substrate 30 and a liquid crystal material-holding surface for holding the liquid crystal material 21 and includes external connection terminals (not shown) arranged on the liquid crystal material-holding surface. The external connection terminals are connected to a semiconductor chip 91, a flexible circuit board 17, and other components.

A lighting unit 11 is located on the rear side of the liquid crystal display panel 20 and includes a light source 13 is mounted on the flexible circuit board 17 and a light-guide plate 15 for guiding light emitted from the light source 13.

FIG. 2 shows the liquid crystal display panel 20 in cross section in an enlarged manner.

With reference to FIG. 2, the element substrate 60 is opposed to the counter substrate 30. A first retardation film 47 and a first polarizing plate 49 are arranged on an outer surface (the upper surface in FIG. 2) of the counter substrate 30 in that order. A second retardation film 87 and a second polarizing plate 89 are arranged on an outer surface (the lower surface in FIG. 2) of the element substrate 60 in that order. The lighting unit 11 (not shown) is located under the element substrate 60.

The counter substrate 30 includes a first base plate 31 made of glass, plastic, or the like; a color filter 37; a counter electrode 33 disposed on the color filter 37; a first alignment layer 45 disposed on the counter electrode 33; and a thickness adjustment layer 41, disposed between the color filter 37 and the counter electrode 33, for optimizing the retardation of each reflective section R and that of each transmissive section T.

The counter electrode 33 is made of indium tin oxide (ITO) or the like, extends over the counter substrate 30, and is sheet-shaped. The color filter 37 includes first color layers 37R, second color layers 37G, third color layers 37B, and a light-shielding layer 39 having portions corresponding to spaces between subpixel regions. The first, second, and third color layers 37R, 37G, and 37B have a red (R) hue, a green (G) hue, and a blue (B) hue, respectively, such that light of a predetermined color is emitted through each of the first, second, and third color layers 37R, 37G, and 37B. The first, second, and third color layers 37R, 37G, and 37B are hereinafter collectively referred to as color layers in some cases.

The first alignment layer 45 is made of a polymer such as polyimide and is subjected to alignment treatment such as rubbing.

The element substrate 60 includes a second base plate 61 made of glass, plastic, or the like; TFTs 69, serving as active elements, for switching; a transparent insulating layer 81; pixel electrodes 63 disposed above the TFTs 69 with the transparent insulating layer 81 located therebetween; and a second alignment layer 85 extending over the pixel electrodes 63. The pixel electrodes 63 correspond to the subpixel regions.

With reference to FIG. 2, the pixel electrodes 63 each include a light-reflective film 79, disposed in the reflective section R, for reflecting light and a transparent electrode portion 63b which is disposed in the transmissive section T and which is made of ITO or the like. The light-reflective film 79, which is a portion of each pixel electrode 63, is made of a light-reflective material such as aluminum (Al) or silver (Ag). The configuration of the pixel electrode 63 and that of the light-reflective film 79 are not limited to those shown in FIG. 2 and the pixel electrode 63 may be made of ITO and may be attached to an aluminum reflective film.

The second alignment layer 85 is made of a polymer such as polyimide and is subjected to alignment treatment such as rubbing.

The TFTs 69 each include a gate electrode 71 disposed above the second base plate 61; a portion of a gate insulating layer 72, disposed on the gate electrode 71, extending over the second base plate 61; a semiconductor layer 70 disposed above the gate electrode 71 with the gate insulating layer 72 located therebetween; a source electrode 73 located on one side of the semiconductor layer 70; a drain electrode 66 located on the other side of the semiconductor layer 70; and a contact electrode 77 disposed between the source electrode 73 and the drain electrode 66.

The gate electrode 71 extends from a gate bus line (not shown) and the source electrode 73 extends from a source bus line (not shown). The gate bus lines extend in the lateral direction of the element substrate 60 and are arranged in parallel to each other at equal intervals in the longitudinal direction thereof. The source bus lines extend in the longitudinal direction of the element substrate 60 and are arranged in parallel to each other at equal intervals in the lateral direction thereof. The source bus lines intersect with the gate bus lines in plan view with the gate insulating layer 72 located therebetween.

The gate bus lines are connected to a liquid crystal-driving integrated circuit (IC) to serve as scanning lines. The source bus lines are connected to another driving IC to serve as signal lines.

The pixel electrodes 63 are disposed in portions of rectangular regions defined by the gate and source bus lines exclusive of portions corresponding to the TFTs 69. The subpixel regions are arranged to correspond to the pixel electrodes 63.

The gate bus lines and the gate electrodes 71 may be made of chromium, tantalum, or the like. The gate insulating layer 72 may be made of silicon nitride ($SiN_x$), silicon oxide ($SiO_x$), or the like. The semiconductor layers 70 may be made of doped amorphous silicon (a-Si), polysilicon, cadmium selenide (CdSe), or the like. The contact electrodes 77 may be made of a-Si or the like. The source bus lines, the source electrodes 73, which are portions of the source bus lines, and the drain electrodes 66 may be made of titanium, molybdenum, aluminum, or the like.

An organic insulating layer 81 extends over the second base plate 61 to cover the gate bus lines, the source bus lines, and the TFTs 69. The organic insulating layer 81 has contact holes 83 located at positions corresponding to the drain electrodes 66. The pixel electrodes 63 are electrically connected to the drain electrodes 66 of the TFTs 69 through the contact holes 83.

The organic insulating layer 81 has resin portions, located at positions corresponding to the reflective sections R, having an irregular pattern of peaks and valleys. This allows the light-reflective films 79 (63*a*) to have such an irregular pattern. The transmissive sections T have no irregular pattern.

With reference to 1B, the lighting unit 11 includes the light source 13 and the light-guide plate 15 as described above. The light source 13 is mounted on the flexible circuit board 17, which is electrically connected to the liquid crystal display panel 20. The light-guide plate 15 is located on the rear side of the liquid crystal display panel 20 and guides light emitted from the light source 13 to the liquid crystal display panel 20.

The light source 13 usually includes a light-emitting diode (LED). Alternatively, the light source 13 may include a fluorescent tube. The light-guide plate 15 is a transparent, flat member made of an acrylic resin or the like and includes a light-reflective sheet or film (not shown) located on the side opposite to the liquid crystal display panel 20. The light source 13 and the light-guide plate 15 may be known ones.

When the electro-optical device 10 operates in a reflective mode, external light such as sunlight or lamplight enters the liquid crystal display panel 20 through the counter substrate 30, passes through the color filter 37 and the liquid crystal material 21 to reach the light-reflective films 79, is reflected by the light-reflective films 79, and then passes through the color filter 37 and the liquid crystal material 21 again to exit the liquid crystal display panel 20.

When the electro-optical device 10 operates in a transmissive mode, light emitted from the lighting unit 11 turned on enters the liquid crystal display panel 20 and passes through the transparent electrode portion 63*b*, the color filter 37, and the liquid crystal material 21 to exit the liquid crystal display panel 20.

Light beams are colored when the light beams pass though the subpixel regions. The colored light beams are emitted from the liquid crystal display panel 20, whereby a color image is displayed on the display field.

2. Color Filter (1) Configuration of Color Filter

The color filter 37, which is characteristic of the present invention, will now be described in detail.

The color filter 37 includes the first, second, and third color layers 37R, 37G, and 37B of the additive primary colors as described above. A color resist for forming the first, second, or third color layers 37R, 37G, or 37B is prepared in such a manner that a colorant such as a pigment or a dye is dispersed in a transparent resin and the concentration of the colorant in the dispersion is adjusted such that the dispersion has a predetermined color hue.

The first, second, and third color layers 37R, 37G, and 37B have such a red hue, a green hue, and a blue hue, respectively, as described above. The first, second, and third color layers 37R, 37G, and 37B are arranged in a predetermined pattern such that a light beam having a predetermined color hue is emitted from each subpixel region.

Some of the subpixel regions, from which light beams passing through the first, second, and third color layers 37R, 37G, or 37B to have different color hues are emitted, form one pixel. Color mixing is performed in such a manner that the subpixel regions present in each pixel are turned on or off or the intensity of light beams emitted from the subpixel regions present therein is adjusted, whereby a light beam having a predetermined color hue is emitted from the pixel.

(2) Two-color Dots

In the color filter 37, as shown in FIGS. 3A to 3F, at least two of each first color layer 37R, each second color layer 37G, and each third color layer 37B are arranged in one of the subpixel regions so as not to overlap with each other in plan view. Each pixel includes the subpixel regions having different color hues; hence, a displayable color tone can be adjusted using existing color resists without changing the colors of the color resists and therefore the reproducibility of colors can be enhanced.

As shown in FIG. 3A, for example, the following subpixel regions may form one pixel: each subpixel region R in which one of the first color layers 37R made of a red color resist is placed, each subpixel region G in which one of the second color layers 37G made of a green color resist is placed, and each subpixel region B in which one of the first color layers 37R is placed in one of the third color layers 37B made of a blue color resist so as not to overlap with this third color layer 37B in plan view and which has a magenta hue.

This pixel can be formed so as to include the subpixel region B having such a magenta hue in such a manner that the first color layer 37R is placed in the second color layer 37G so as not to overlap with the second color layer 37G in plan view as described above. Therefore, the color resists can be commonly used regardless of the type an electronic apparatus including the electro-optical device 10. The hue of a color reproduced by this pixel can be adjusted without causing an increase in manufacturing cost. The reproducibility of the color of a displayed image can be enhanced. The color filter 37 can be prepared by patterning the color resists; hence, the number of manufacturing steps is not increased.

Examples of a combination, other than the above combination of the first color layer 37R and the second color layer 37G, for adjusting the color hue of the subpixel regions using the R, G, and B color resists include a combination of the second color layer 37G and second color layer 37G for forming a subpixel region B having a cyan hue as shown in FIG. 3B, a combination of the first color layer 37R and second color layer 37G for forming a subpixel region R having a magenta hue as shown in FIG. 3C, a combination of the first color layer 37R and second color layer 37G for forming a subpixel region R having a yellow hue as shown in FIG. 3D, a combination of the second color layer 37G and first color layer 37R for forming a subpixel region G having a yellow hue as shown in FIG. 3E, and a combination of the second color layer 37G and third color layer 37B for forming a subpixel region G having a cyan hue as shown in FIG. 3F.

Color layers having different color hues may be arranged in one of the subpixel regions forming one pixel and may be arranged in two or more of the subpixel regions forming one pixel.

Figure 4A:
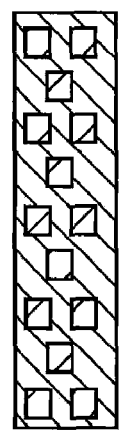
FIGS. 4A to 4C are plan views of subpixel regions each including color layers having different color hues.
Figure 4B:
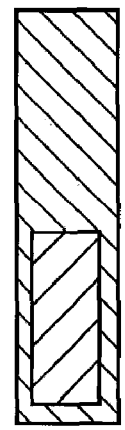
Figure 4C:

In order to arrange color layers of two colors in each subpixel region so as not to overlap with each other in plan view, these color layers may be uniformly distributed in the subpixel region as shown in FIG. 4A. Alternatively, as shown in FIGS. 4B and 4C, these color layers may be arranged in a portion of subpixel region. The area of a zone in which these color layers are arranged, the percentage of these color layers in the subpixel region, the shape of each color layer in plan view can be freely selected depending on the color of each color resist and a target color hue.

In order to reduce the color non-uniformity in the subpixel region, these color layers are preferably uniformly distributed in the subpixel region as shown in FIG. 4A. This is effective in preventing the shift in the color of observed light regardless of the size of the subpixel region. Even if the subpixel region has a reflective section and a transmissive section, substantially the same color can be reproduced in a reflective mode and a transmissive mode.

Figure 5A:
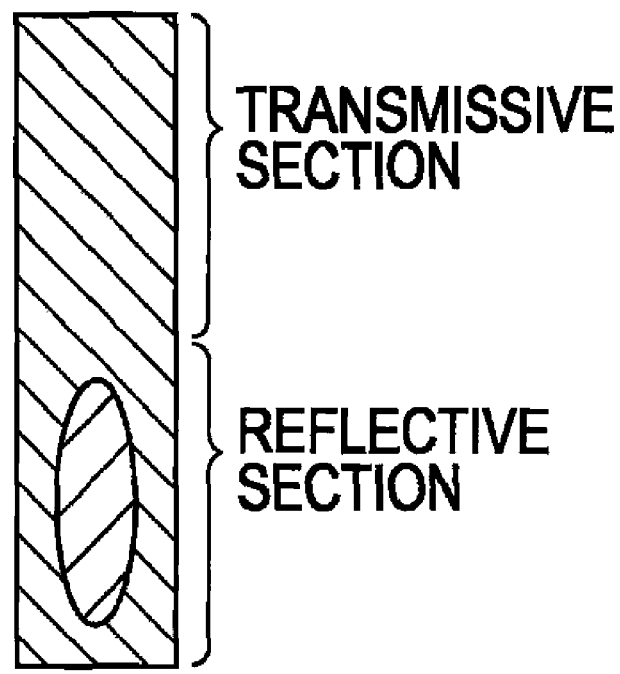
FIGS. 5A and 5B are plan views of subpixel regions each having a transmissive section and a reflective section including color layers having different color hues.
Figure 5B:
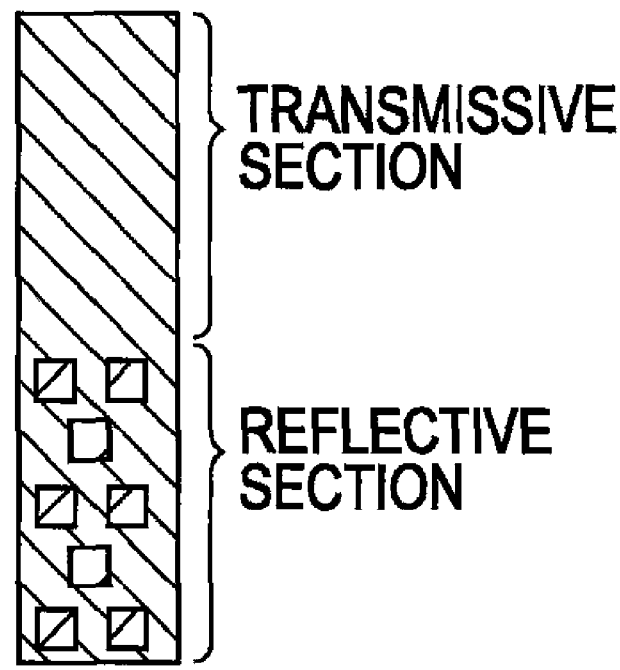

When the subpixel region has the reflective section and the transmissive section, the color layers of different colors are preferably arranged in the reflective section as shown in FIG. 5A or 5B.

According to this configuration, bright CMY display operation may be performed in the reflective section in which light passes through the color layers twice. Although the brightness of the transmissive section in which light passes through one of the color layers once is maintained, the reflective section may be reduced in brightness because light passes through the color layers twice; hence, the reflective section is preferably used for CMY display operation, in which color is relatively light. Therefore, reflective display can be performed in a bright CMY operation mode using juxtapositional additive color mixtures of two or more light beams of different colors without additionally using a C resist, an M resist, and a Y resist.

(3) Three-color Dots

The number of the color layers of different colors arranged in one subpixel region is not limited to two. The color layers of three colors may be arranged in the subpixel region as shown in FIGS. 6A and 6B.

Figure 6A:
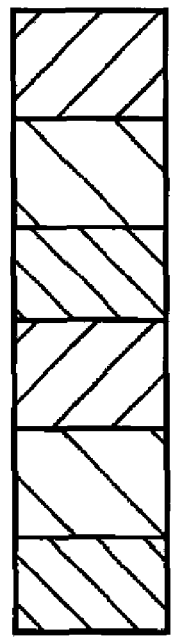
FIGS. 6A and 6B are plan views of subpixel regions each including three color layers having different color hues.
Figure 6B:
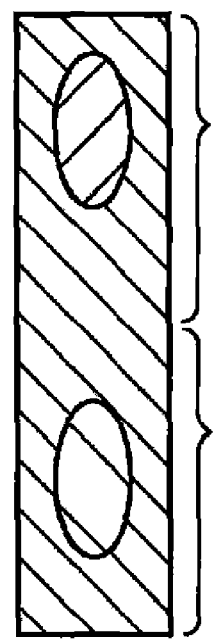

The color hue of the subpixel region can be adjusted or the color hues of portions of the subpixel region can be individually adjusted in such a manner that all the color resists are provided in the subpixel region so as not to overlap with each other in plan view.

when the color layers of the three primary colors are arranged in a portion or the whole of each subpixel region so as not to overlap with each other in plan view as shown in FIG. 6A, light passing through the subpixel region is substantially white.

Alternatively, each subpixel region may be divided into a plurality of sections such that a red color layer and a green color layer are arranged in one of the sections and another red color layer and a blue color layer are arranged in the other of the sections. This allows, for example, a reflective section and a transmissive section to have a cyan, magenta, or yellow hue and a red, green, or blue, respectively. Therefore, in the reflective section, which is preferably used for CMY display operation, reflective display can be performed in a bright CMY operation mode using juxtapositional additive color mixtures of two or more light beams of different colors without using an additional color resist. Furthermore, a desired color can be reproduced in the transmissive section using a dot region which is adjusted to have a color hue other than the color hue of a color resist.

(4) Total Thickness of Color Layers

Figure 7A:
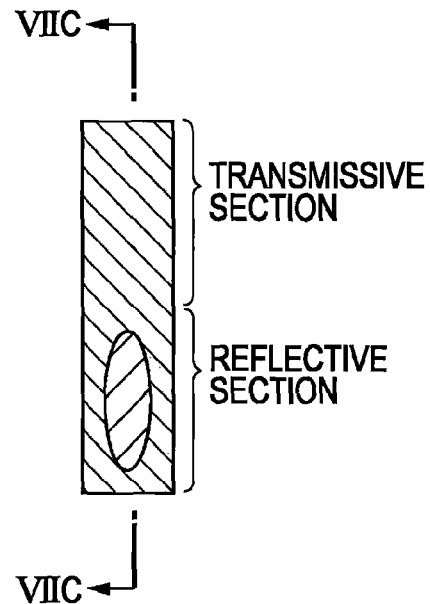
FIGS. 7A and 7B are plan views of subpixel regions each having a transmissive section and a reflective section having a thickness less than that of the transmissive section.
Figure 7C:
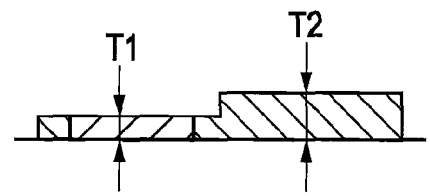
FIG. 7C is a sectional view of the subpixel region taken along the line VIIC-VIIC of FIG. 7A.
Figure 7B:
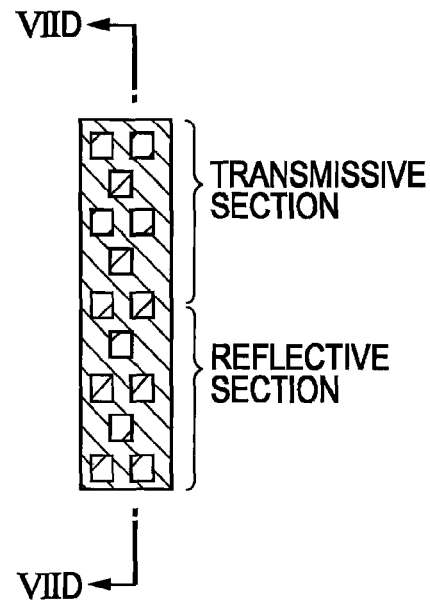
Figure 7D:
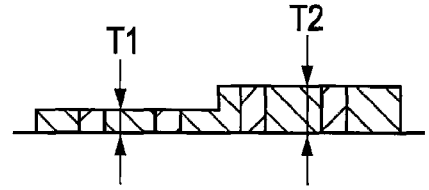
FIG. 7D is a sectional view of the subpixel region taken along the line VIID-VIID of FIG. 7B.

When the color layers of different colors are arranged in one subpixel region so as not to overlap with each other in plan view, the total thickness T1 of each color layer in the reflective section is preferably less than the total thickness T2 of the color layer in the transmissive section as shown in FIGS. 7A and 7B.

This is because a light beam transmitted from the reflective section passes through the color layer thereof twice although a light beam passing through the transmissive section passes through the color layer thereof once only. That is, a change in the thickness of each color layer affects the optical path length thereof to cause a reduction in transmittance. The color density of the subpixel region can be globally adjusted in such a manner that the color layer is formed using, for example, a coloring material of which the color hue is adjusted on the basis of the color density of the light beam passing through the transmissive section and the thickness of the color layer of the reflective section is varied.

(5) Uncolored Zone

Figure 8A:
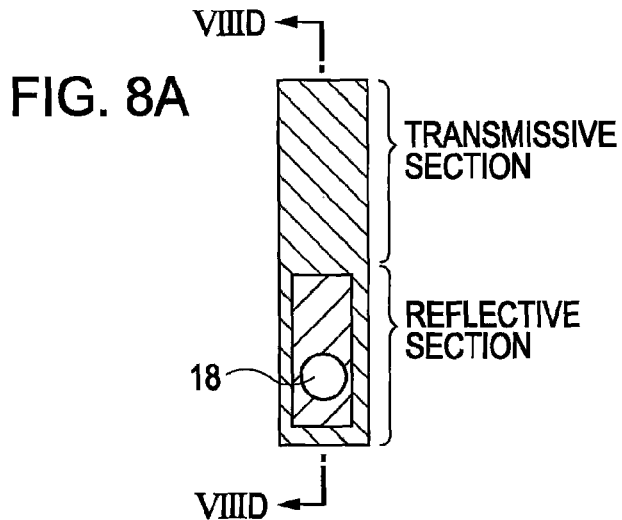
FIGS. 8A to 8C are plan views of subpixel regions each having a transmissive section and a reflective section having one or more uncolored zones.
Figure 8D:
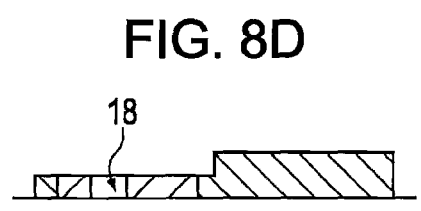
FIG. 8D is a sectional view of the subpixel region taken along the line VIIID-VIIID of FIG. 8A.
Figure 8B:
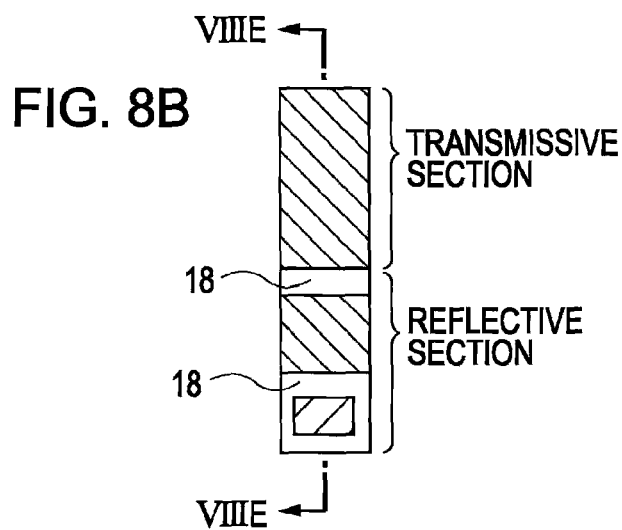
Figure 8E:
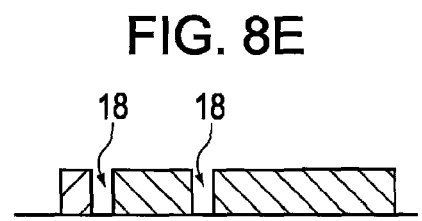
FIG. 8E is a sectional view of the subpixel region taken along the line VIIIE-VIIIE of FIG. 8B.
Figure 8C:
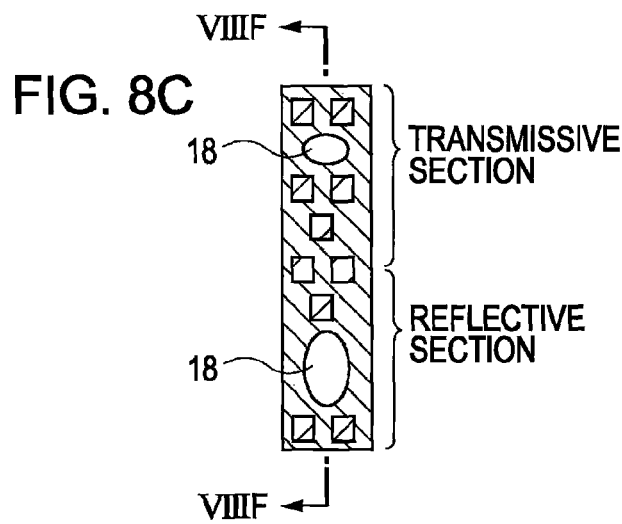
Figure 8F:
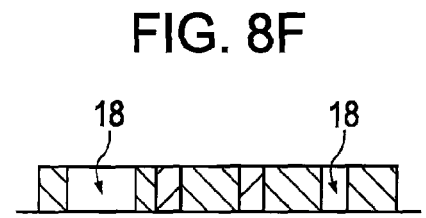
FIG. 8F is a sectional view of the subpixel region taken along the line VIIIF-VIIIF of FIG. 8C.

In order to adjust the color density of the light beam transmitted from the reflective section and the color density of the light beam transmitted from the transmissive section, the reflective section preferably has one or more uncolored zones 18 as shown in FIGS. 8A and 8B with or without controlling the total thickness of the color layers. Alternatively, in order to adjust the color hue of the subpixel region, the uncolored zones 18 are preferably provided in each color layer as shown in FIG. 8C regardless of the reflective section or the transmissive section.

This is because the presence of the uncolored zones 18 increases the transmittance of the subpixel region and reduces the amount of a colored component of light. Therefore, the color hue of the subpixel region can be adjusted by controlling the area of each uncolored zone 18 without preparing color resists for each device.

Figure 9A:
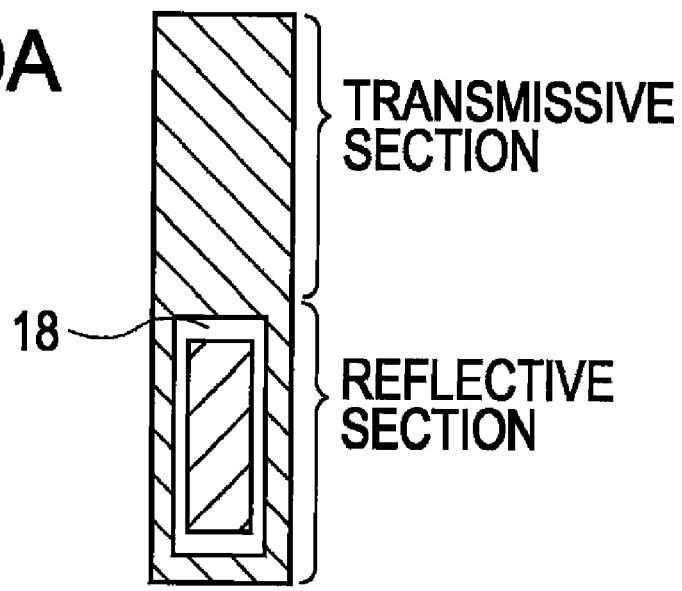
FIGS. 9A and 9B are plan views of subpixel regions each having a transmissive section and a reflective section having an uncolored zone.
Figure 9B:
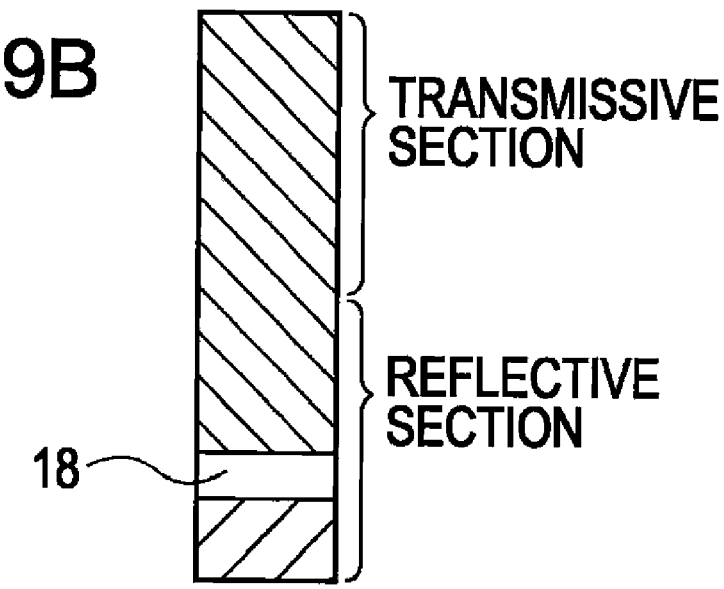

If the uncolored zone 18 is used, the uncolored zone 18 is preferably located at the boundary between the color layers of different colors as shown in FIGS. 9A and 9B. This prevents color from becoming dark because the color layers do not overlap with each other.

Alternatively, the color density of the light beam passing through the subpixel region can be adjusted in such a manner that a thin section is provided in each color layer instead of providing the uncolored zone 18 in the color layer. In this case, the color density of the light beam passing therethrough can be precisely adjusted in such a manner that the area and thickness of the thin section are controlled.

The shape of the uncolored zone 18 in plan view is not particularly limited and may be arbitrarily selected.

(6) Alignment Bumps

In order to prevent the color layers of different colors from overlapping with each other, the color layers may each have at least one alignment bump for controlling the alignment direction of molecules of the liquid crystal material if the balance between the color hues of the subpixel regions matches the percentage of the color layers in each subpixel region.

The alignment bumps may cause the liquid crystal material molecules supplied with no voltages to be tilted at a predetermined angle such that the viewing angle or contrast of a displayed image is enhanced when the liquid crystal material is a vertical alignment (VA) type.

If the liquid crystal material molecules supplied with no voltages are tilted at a predetermined angle, the response speed of the liquid crystal material molecules can be increased and the alignment direction of the liquid crystal material molecules supplied with voltages can be controlled; hence, the viewing angle or contrast of a displayed image is enhanced.

The alignment bumps may have a tapered shape such as a conical shape, a triangular pyramid shape, or a quadrangular pyramid shape. This enhances viewing properties of the electro-optical device 10 in various directions.

Alternatively, the alignment bumps may have a triangular shape, a rectangular shape, or a semicircular shape in cross section and may have a line shape in plan view. This enhances viewing properties of the electro-optical device 10 in a specific direction and allows the electro-optical device 10 to display a bright image.

When the alignment bumps have a line shape in plan view, the alignment bumps may be arranged in a zigzag pattern or arranged to cross at right angles. This also enhances viewing properties of the electro-optical device 10 in various directions.

(7) Arrangement Pattern of Subpixel Regions

The subpixel regions having the same color hue are usually arranged in a striped pattern and may be arranged in a diagonal mosaic pattern, a delta pattern, or another pattern.

Figure 10A:
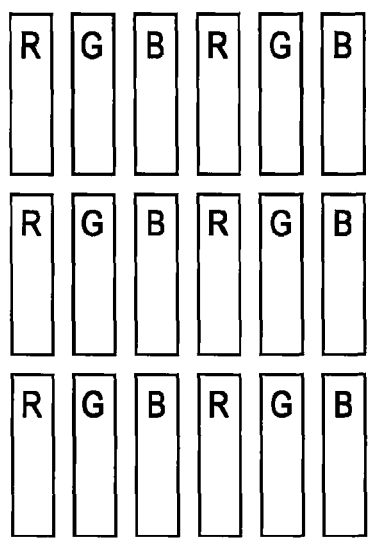
FIG. 10A is an illustration showing subpixel regions, having the same color hues, arranged in a striped pattern.
Figure 10B:
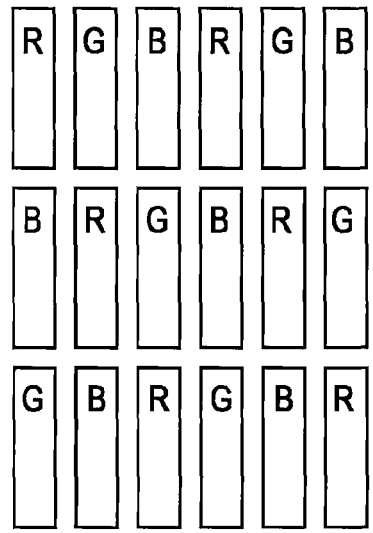
FIG. 10B is an illustration showing subpixel regions, having the same color hues, arranged in a mosaic pattern.
Figure 10C:
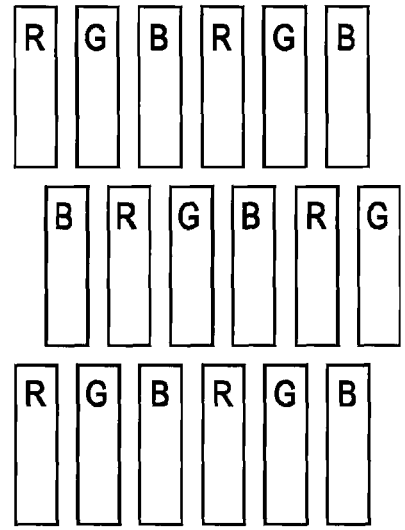
FIG. 10C is an illustration showing subpixel regions, having the same color hues, arranged in a delta pattern.

FIG. 10A shows the subpixel regions, arranged in a striped pattern, having the same color hue. FIG. 10B shows the subpixel regions, arranged in a mosaic pattern, having the same color hue. FIG. 10C shows the subpixel regions, arranged in a delta pattern, having the same color hue.

In particular, the striped pattern shown in FIG. 10A is preferable, because a mask used to form the color layers need not have a complicated pattern and the color layers of a single color can be continuously formed.

Second Embodiment

A second embodiment of the present invention provides a method for manufacturing the electro-optical device 10 according to the first embodiment.

The method is characterized in that the color layers of different colors are sequentially formed such that the color layers of two or more colors are arranged in at least one of the subpixel region in each pixel so as not to overlap with each other in plan view.

The method will now be described in detail with reference to FIGS. 11 to 13.

1. Preparation of Element Substrate

The element substrate 60 can be prepared by a known process. The following components are formed above the second base plate 61 made of, for example, glass: the TFTs 69, the gate bus lines, the source bus lines, the external connection terminals, the pixel electrodes 63, and the like. The second alignment layer 85 made of polyimide is provided over the pixel electrodes 63. The element substrate 60 including various electric lines and conductive layers is thus obtained.

2. Preparation of Counter Substrate (Color Filter Substrate)

The counter substrate 30, which serves as a color filter substrate, is prepared as described below. The counter substrate 30 is made of, for example, glass, is large in size, and has a cell region. The following components are formed above the counter substrate 30 so as to correspond to the cell region: the color layers, the light-shielding layer 39, the counter electrode 33, and the like. The first alignment layer 45 made of polyimide is provided over the counter electrode 33, whereby the counter substrate 30 is obtained.

In the method, the color layers of different colors are sequentially formed such that the color layers of two or more colors are arranged in at least one of the subpixel region in each pixel so as not to overlap with each other in plan view.

Figure 11A:
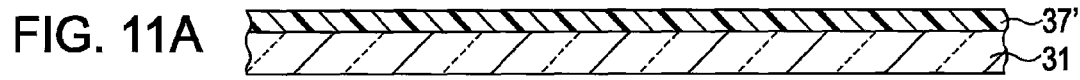
FIGS. 11A to 11E are illustrations showing steps of forming color layers.
Figure 11B:
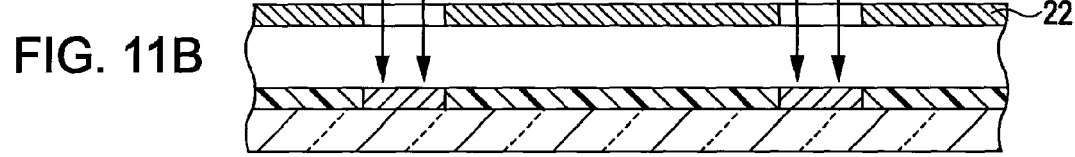
Figure 11C:
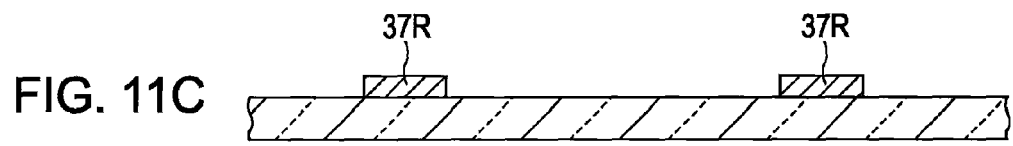

In particular, as shown in FIG. 11A, the first base plate 31 is uniformly coated with a color resist prepared by dispersing a red pigment in a photosensitive resin using a coating machine such as a spin coater such that a resin layer containing the red pigment is formed thereon. As shown in FIGS. 11B and 11C, the resin layer is exposed through a pattern mask having light-transmissive regions arranged in a predetermined pattern and then developed using a developer, whereby the first color layers 37R are formed.

The coating operation, exposure operation, development operation described above are repeated using a color resist containing the photosensitive resin and a green pigment and then a color resist containing the photosensitive resin and a blue pigment, whereby the second color layers 37G and the third color layers 37B are formed.

Figure 11D:
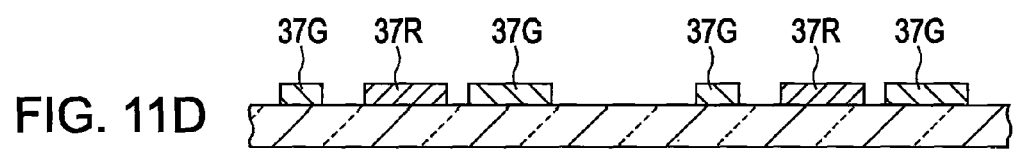
Figure 11E:
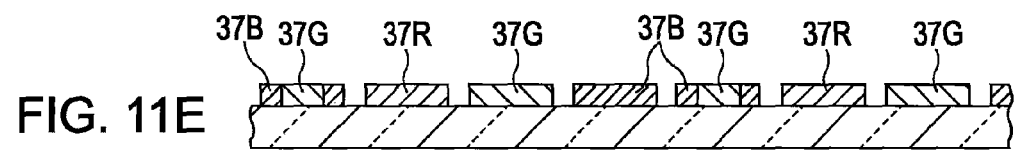

At least two of each first color layer 37R, each second color layer 37G, and each third color layer 37B are formed in at least one of the subpixel regions forming each pixel so as not to overlap with each other in plan view as shown in FIGS. 11D and 11C.

If the subpixel region needs to have a magenta-red hue, the first color layer 37R and the third color layer 37B are formed in the subpixel region by patterning so as not to overlap with each other in plan view. If the subpixel region needs to have a cyan-blue hue, the third color layer 37B and the second color layer 37G are formed in the subpixel region by patterning so as not to overlap with each other in plan view. If the subpixel region needs to have a yellow-green hue, the second color layer 37G and the first color layer 37R are formed in the subpixel region by patterning so as not to overlap with each other in plan view. Alternatively, the subpixel region may be divided into a plurality of subregions such that the first color layers 37R and the third color layers 37B are arranged in some of the subregions and the first color layers 37R and the second color layers 37G are arranged in the other subregions so as not to overlap with each other in plan view. This allows the color filter 37 to have color hues suitable for both transmissive display and reflective display.

Since the subpixel regions can be formed using the red, green, and blue color resists so as to have various color hues as described above, the reproducibility of a displayed color can be adjusted without using an additional color resist.

Therefore, the electro-optical device 10, which can display a high-quality image, can be efficiently manufactured without increasing manufacturing cost or the number of manufacturing steps in such a manner that the range of reproducible colors is adjusted.

Figure 12A:
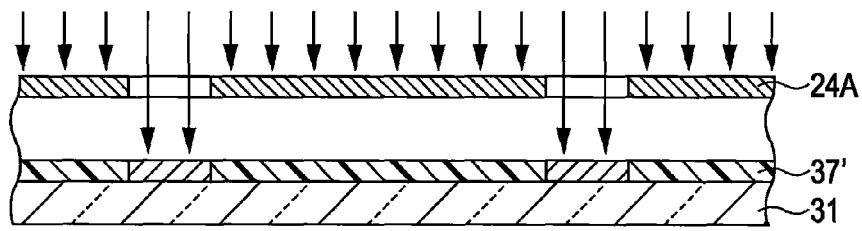
FIGS. 12A to 12C are illustrations showing steps of forming color layers by multi-step exposure.
Figure 12B:
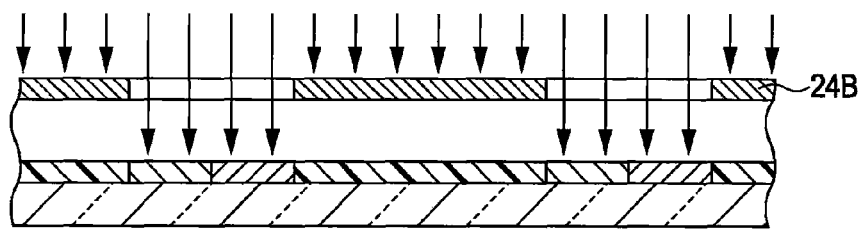
Figure 12C:
Figure 13A:
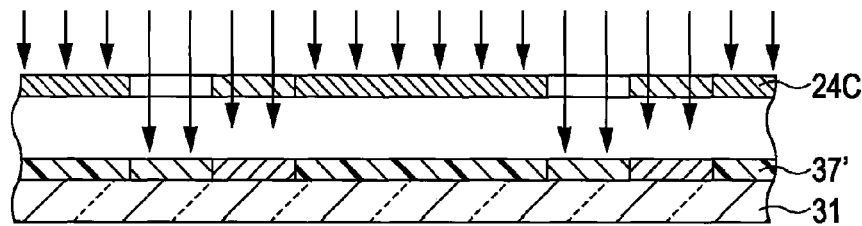
FIGS. 13A and 13B are illustrations showing steps of forming color layers using a halftone mask.
Figure 13B:
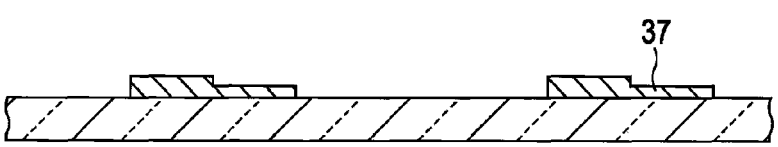

Uncolored zones or thin sections can be formed in such a manner that a plurality of pattern masks having different patterns are used to form the color layers as shown in FIGS. 12A to 12C or a halftone mask having portions with different transmittances is used to form the color layers as shown in FIGS. 13A and 13B. In particular, if a positive photosensitive resin material is used to form the color layers, an increase in exposure reduces the thickness of the color layers. Therefore, the color layers can be formed so as to have desired thicknesses in such a manner that a layer of the positive photosensitive resin material is divided into first portions for forming thick sections and second portions for forming the thin sections or the uncolored zones, the exposure of the first portions is reduced, and the exposure of the second portions is increased.

This allows the color hue of each subpixel region to be adjusted and also allows the color density thereof to be varied. Therefore, desired color filters can be prepared using the same color resists such that the color hue and brightness of the subpixel region are adjusted, even if these color filters are used for different apparatuses.

The photosensitive resin material for forming the color resists is not particularly limited. Examples of the photosensitive resin material include acrylic resins, epoxy resins, silicone resins, phenol resins, and oxetane resins. These resins may be used alone or in combination. The photosensitive resin material can be classified into a positive type and a negative type. A positive type of photosensitive resin material is as follows: portions thereof that are irradiated with light are photodegraded and therefore are soluble in a developer. A negative type of photosensitive resin material is as follows: portions thereof that are irradiated with light are cured and therefore are insoluble in a developer. The photosensitive resin material is usually a positive type and may be a negative type.

The color filter 37 may be attached to the element substrate 60 instead of the counter substrate 30.

The color filter 37 can be formed together with the light-shielding layer 39 in such a manner that the first, second, and third color layers 37R, 37G, and 37B overlap with of portions corresponding to spaces between the subpixel regions.

3. Preparation of Liquid Crystal Display Panel

The sealing member, which is not shown, is provided on the counter substrate 30 or the element substrate 60 so as to surround the display field. The counter substrate 30 and the element substrate 60 are overlap with each other, heated, and then pressed against each other, whereby the counter substrate 30 and the element substrate 60 are bonded to each other and therefore a cell structure is obtained. The liquid crystal material 21 is injected between the counter substrate 30 and the element substrate 60 through an inlet located in the sealing member by a vacuum injection process and the inlet is sealed with a sealant or the like, whereby the liquid crystal display panel 20 is obtained.

Alternatively, the liquid crystal display panel 20 can be prepared by the following procedure: the sealing member is provided on the counter substrate 30 or the element substrate 60 by a printing process so as to surround the display field, the liquid crystal material 21 is provided in an area inside the sealing member, and the counter substrate 30 and the element substrate 60 are then bonded to each other.

4. Assemble

The first retardation film 47 (a ¼λ film) and the first polarizing plate 49 are provided on the outer surface of the counter substrate 30 in that order, the second retardation film 87 (a ¼λ film) and the second polarizing plate 89 are provided on the outer surface of the element substrate 60 in that order, a driver is connected to the liquid crystal display panel 20, and the liquid crystal display panel 20 and a backlight are provided in a housing, whereby the electro-optical device 10 is obtained as shown in FIGS. 1A and 1B.

Third Embodiment

A third embodiment of the present invention provides an electro-optical device which is similar to that according to the first embodiment except that one pixel includes subpixel regions including color layers of two or more colors and subpixel regions including color layers of a single color and the number of the subpixel regions present in the pixel is greater than or equal to the number of color resists for forming a color filter.

The color filter, which is the difference between the electro-optical device of this embodiment and that of the first embodiment, will now be described in detail.

The color filter used in this embodiment, as well as that used in the first embodiment, includes a plurality of color layers of different additive colors such as red, green, and blue.

With reference to FIGS. 14 to 17, at least two of each first color layer 37R, each second color layer 37G, and each third color layer 37B are arranged in at least one of subpixel regions so as not to overlap with each other. Each subpixel includes the subpixel regions each including at least two of the first, second, and third color layers 37R, 37G, and 37B and the subpixel regions each including one of the first, second, and third color layers 37R, 37G, and 37B. That is, the pixel is configured using existing color resists without changing the colors of the color resists so as to include the subpixel regions having the same color hues as those of the color resists and the subpixel regions having color hues different from those of the color resists. Hence, a color image can be displayed using many colors in addition to the three additive primary colors. This allows multicolor displays to reproduce a wide range (gamut) of colors.

Figure 14A:
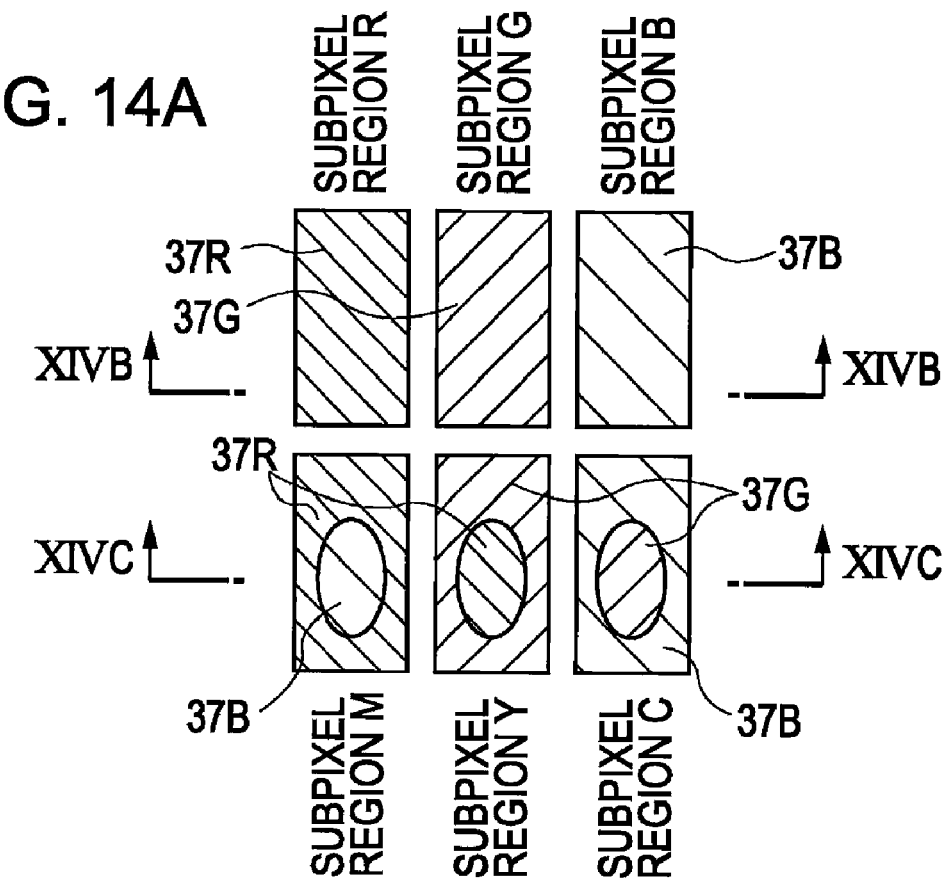
FIG. 14A is a plan view of a pixel including six subpixel regions having different color hues.
Figure 14B:
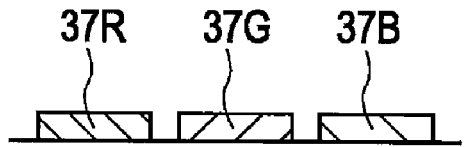
FIG. 14B is a sectional view of three of the six subpixel regions taken along the line XIVB-XIVB of FIG. 14A.
Figure 14C:
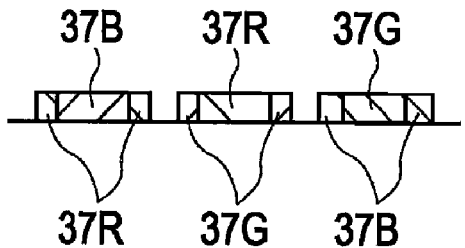
FIG. 14C is a sectional view of the other three of the six subpixel regions taken along the line XIVC-XIVC of FIG. 14A.

The first, second, and third color layers 37R, 37G, and 37B are made of a color resist having a red hue, a color resist having a green hue, and a color resist having a blue hue, respectively. As shown in FIG. 14, the following six subpixel regions may form one pixel: a subpixel region R in which one of the first color layers 37R is placed, a subpixel region G in which one of the second color layers 37G is placed, a subpixel region B in which one of the third color layers 37B is placed, a subpixel region M in which one of the first color layers 37R and one of the third color layers 37B are arranged so as not to overlap with each other in plan view, a subpixel region C in which one of the third color layers 37B and one of the second color layers 37G are arranged so as not to overlap with each other in plan view, and a subpixel region Y in which one of the second color layers 37G and one of the first color layers 37R are arranged so as not to overlap with each other in plan view.

A light beam passing through each subpixel region having two of the first, second, and third color layers 37R, 37G, and 37B has a cyan, magenta, or yellow hue. Each pixel can be configured with the six subpixel regions each having a red, green, blue, cyan, magenta, or yellow hue without using an additional color resist. Therefore, the range of colors reproduced by the pixel can be increased by controlling the operation of the six subpixel regions without causing an increase in manufacturing cost. This enhances the reproducibility of a displayed image. The color filter can be formed by patterning the above color resists. This does not increase the number of manufacturing steps.

Figure 15A:
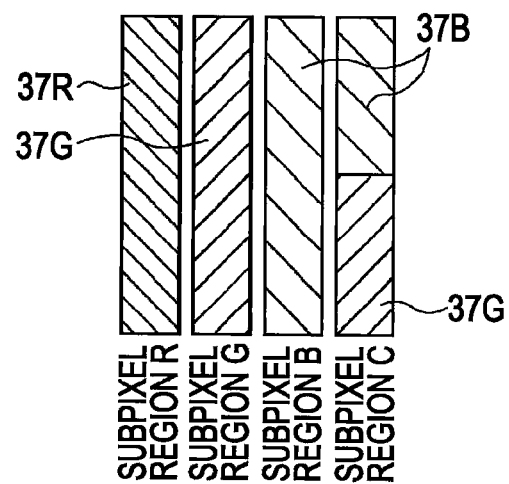
FIGS. 15A to 15C are plan views of pixels each including four subpixel regions having different color hues.
Figure 15B:
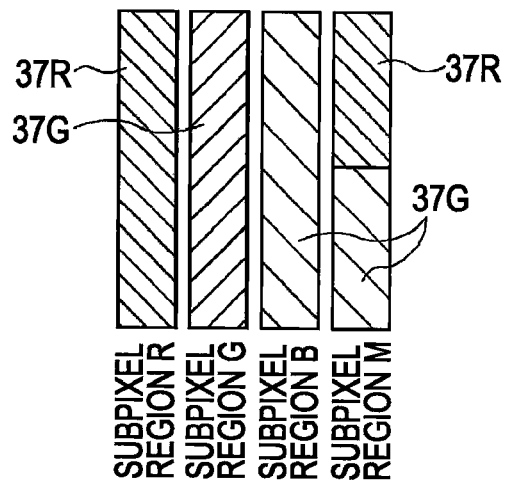
Figure 15C:
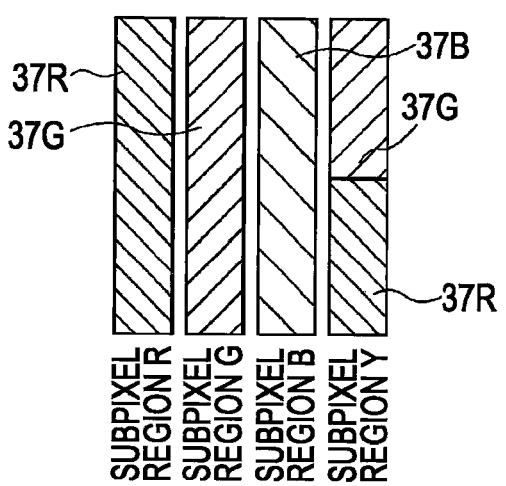
Figure 16A:
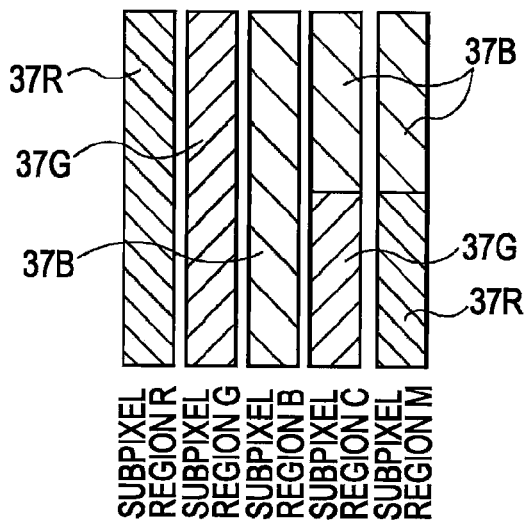
FIGS. 16A to 16C are plan views of pixels each including five subpixel regions having different color hues.
Figure 16B:
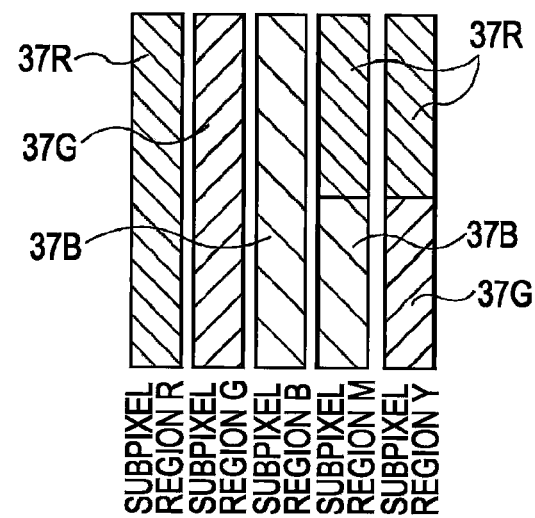
Figure 16C:
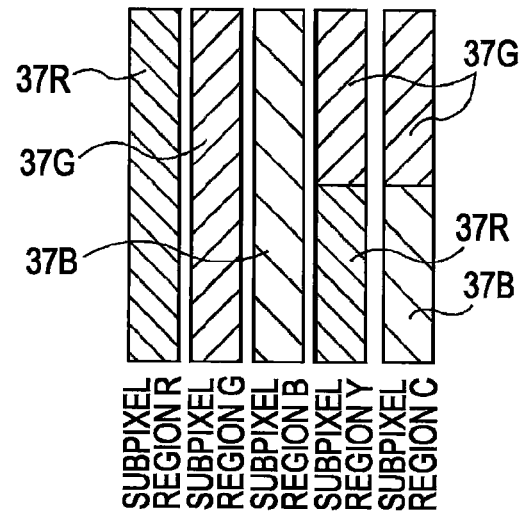

In order to form cyan, magenta, and yellow dots, the following filter may be used other than the color filter having such six color hues: a color filter having a red, a green, a blue, and a cyan hue; a color filter having a red, a green, a blue, and a magenta hue; or a color filter having a red, a green, a blue, and a yellow hue as shown in FIGS. 15A to 15C. Alternatively, the following filter may be used: a color filter having a red, a green, a blue, a cyan, and a magenta hue; a color filter having a red, a green, a blue, a magenta, and a yellow hue; or a color filter having a red, a green, a blue, a yellow, and a cyan hue as shown in FIGS. 16A to 16C.

A three-, four- or five-color color filter may be formed in such a manner that a plurality of subpixel regions having similar color hues are used and color layers having different color hues are arranged in the subpixel regions such that the color hues of the subpixel regions are precisely adjusted.

The four-color color filter will now be described in detail. Color regions of four colors within the visible wavelength range (380 to 780 nm) are as follows: color regions having a blue-based hue, color regions having a red-based hue, and two types of color regions each having a color hue ranging from blue to yellow. The term "blue-based hue" is not limited to pure blue and covers blue-purple, blue-green, and the like. The term "red-based hue" is not limited to pure red and covers orange and the like. The color hues of these color regions may be varied depending on chroma and/or brightness.

In particular, the color hue of the blue-based color regions preferably ranges from blue-purple to blue-green and more preferably deep blue to blue, the color hue of the red-based color regions ranges from orange to red, the color hue of one of the two types of color regions each having a color hue ranging from blue to yellow preferably ranges from blue to green and more preferably blue-green to green, and the color hue of the other one preferably ranges from green to orange and more preferably green to yellow or yellow-green.

These color regions are different in color hue from each other. When a green-based color is used in two color regions each having a color hue ranging from blue to yellow, a green-based color is used in one of the two color regions and a blue-based or yellow-green-based color is used in the other one. This allows a wider range of colors to be reproduced as compared to conventional color regions of red, green, and blue.

The reproducibility of a wide range of colors by the use of the color regions of four colors is as described above. In particular, the wavelength of light passing through each color region is as described below.

The peak wavelength of light passing through each blue-based color region is preferably between 415 and 500 nm and more preferably between 435 and 485 nm. The wavelength of light passing through each red-based color region is preferably 600 nm or more and more preferably 605 nm or more. The wavelength of light passing through one of the two types of color regions each having a color hue ranging from blue to yellow is preferably between 485 and 535 nm and more preferably between 495 and 520 nm. The wavelength of light passing through the other one is preferably between 500 and 590 nm and more preferably between 510 and 585 nm or between 530 and 565 nm.

These wavelengths are determined in such a manner that light is transmitted through a color filter in the case of transmissive display or in such a manner that external light is reflected in the case of reflective display.

The color regions of four colors can be defined using x-y chromaticity diagrams as described below.

The blue-based color region is defined as an area that preferably satisfies the inequalities $x \leq 0.151$ and $y \leq 0.200$ and more preferably $0.134 \leq x \leq 0.151$ and $0.034 \leq y \leq 0.200$. The red-based color region is defined as an area that preferably satisfies the inequalities $0.520 \leq x$ and $y \leq 0.360$ and more preferably $0.550 \leq x \leq 0.690$ and $0.210 \leq y \leq 0.360$. One of the two types of color regions each having a color hue ranging from blue to yellow is defined as an area that preferably satisfies the inequalities $x \leq 0.200$ and $0.210 \leq y$ and more preferably $0.080 \leq x \leq 0.200$ and $0.210 \leq y \leq 0.759$. The other one is defined as an area that preferably satisfies the inequalities $0.257 \leq x$ and $0.450 \leq y$ and more preferably $0.257 \leq x \leq 0.520$ and $0.450 \leq y \leq 0.720$.

The x-y chromaticity diagrams of these regions are determined in such a manner that light is transmitted through a color filter in the case of transmissive display or in such a manner that external light is reflected in the case of reflective display.

When each subpixel region has a transmissive section and a reflective section, the color regions of four colors are set such that the transmissive section and the reflective section can be used under the above conditions.

Examples of the color regions of four colors include color regions each having a red, blue, green, or blue-green hue; color regions each having a red, blue, green, or yellow hue; color regions each having a red, blue, deep green, or yellow hue; color regions each having a red, blue, emerald green, or yellow hue; color regions each having a red, blue, deep green, or yellow-green hue; and color regions each having a red, blue-green, deep green, or yellow-green hue.

Figure 17:
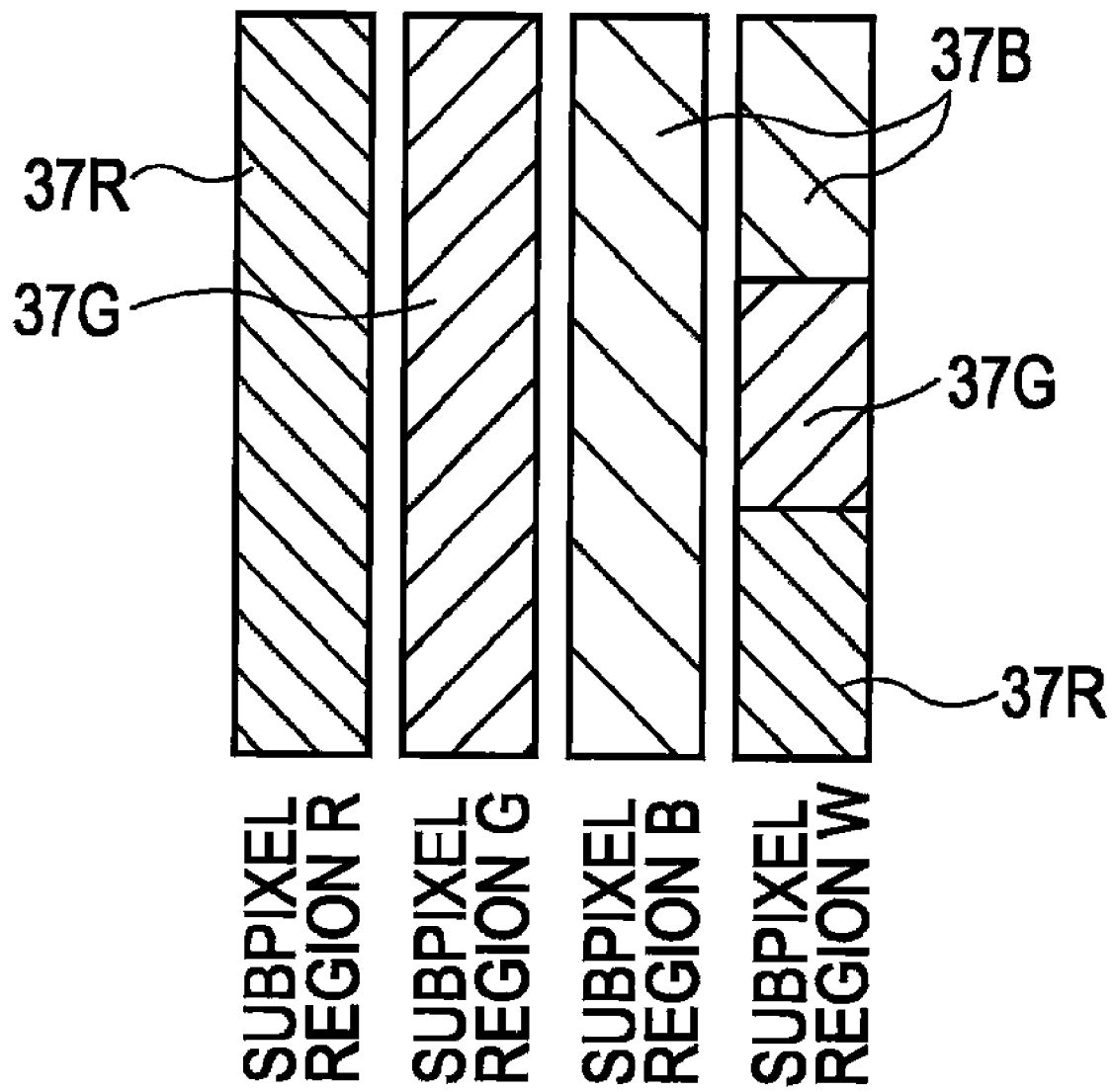
FIG. 17 is a plan view of a pixel including four subpixel regions which have different color hues and one of which has a white hue.

As shown in FIG. 17, one pixel may be configured in such a manner that subpixel regions each having a red, green, or blue hue are formed using color resists each having a red, green, or blue hue, respectively, a subpixel region in which color layers each having a red, green, or blue hue are arranged so as not to overlap with each other in plan view and which has a white hue is formed, and the subpixel regions each having a red, green, blue, or white hue are combined into one.

Since the white subpixel region can be formed by arranging the red, green, and blue color layers therein, the white subpixel region can be formed in one pixel without using an additional color resist. This increases the brightness of a white area in a displayed image and enhances the contrast thereof.

The white subpixel region may be used in combination with subpixel regions C, M, and Y in addition to the subpixel regions R, G, and B.

An increase in the number of the subpixel regions forming one pixel increases the size of the pixel to cause a coarse image to be displayed. Therefore, the number of the subpixel regions forming one pixel and/or the color hue of an additional subpixel region is preferably determined depending on the desired performance of the electro-optical device.

One pixel including a plurality of the subpixel regions preferably has substantially a square shape such that an image can be displayed with smooth lines.

In this embodiment as well as the first embodiment, the color layers having different color hues may be arranged in all or at least one of the subpixel regions forming one pixel so as not to overlap with each other in plan view. When the color layers are arranged in at least one of the subpixel regions, the total thickness of each color layer in the reflective section is preferably less than the total thickness of the color layer in the transmissive section.

The color layers may have uncolored zones, thin sections, or alignment bump for controlling the alignment direction of molecules of a liquid crystal material.

Figure 18A:
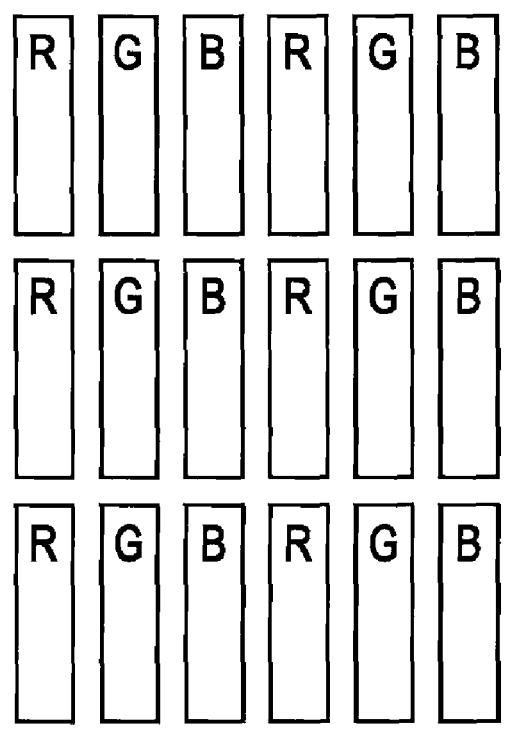
FIGS. 18A and 18B are illustrations of arrangements of subpixel regions having the same color hues.
Figure 18B:
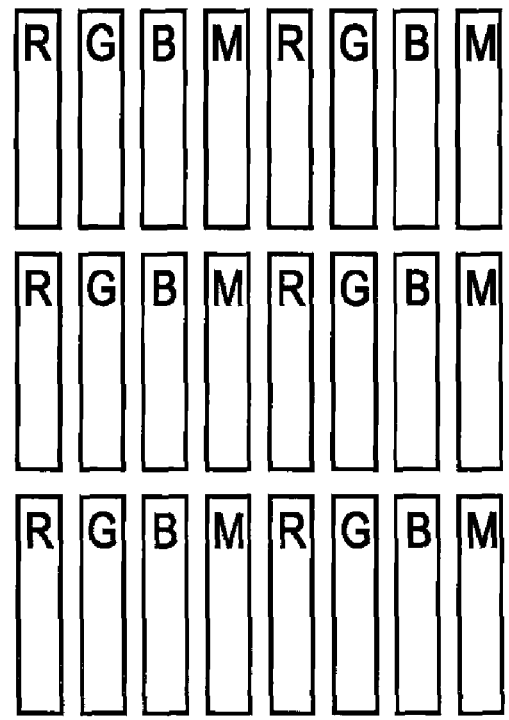
Figure 19A:
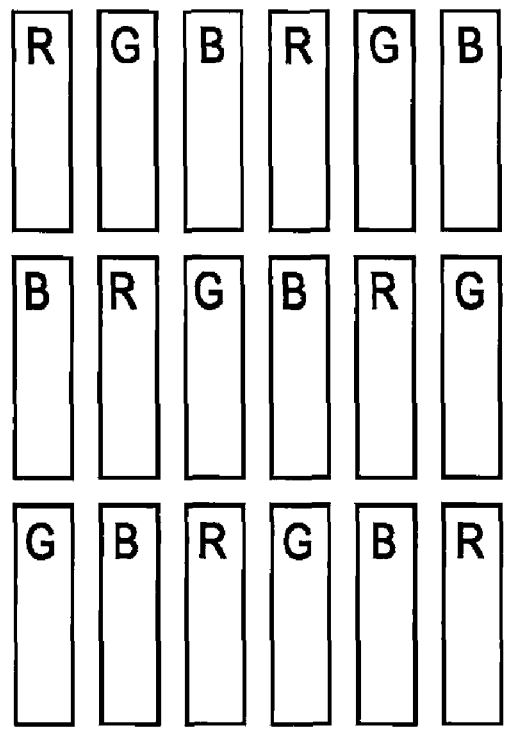
FIGS. 19A and 19B are illustrations of arrangements of subpixel regions having the same color hues.
Figure 19B:
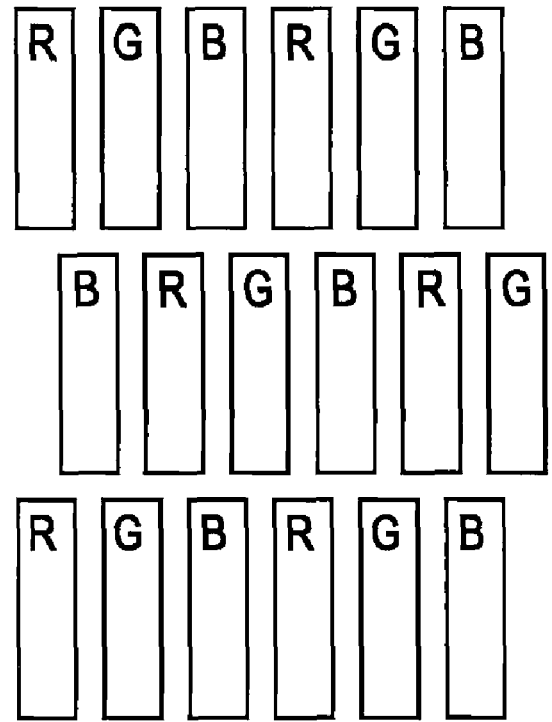
Figure 20:
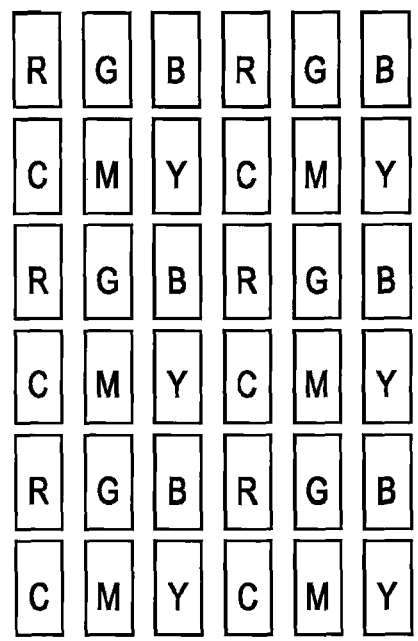
FIG. 20 is an illustration of an arrangement of subpixel regions having the same color hues.

The subpixel regions having the same color hue may be arranged in a striped pattern as shown in FIG. 18A or 18B, a mosaic pattern as shown in FIG. 19A, or a delta pattern as shown in FIG. 19B. Alternatively, as shown in FIG. 20, subpixel regions R, G, and B may be arranged in an upper portion of one pixel and subpixel regions C, M, and Y may be arranged in a lower portion thereof such that these subpixel regions are alternately arranged.

Fourth Embodiment

A fourth embodiment of the present invention provides an electronic apparatus including the electro-optical device according to the first embodiment. The electronic apparatus will now be described in detail.

Figure 21:
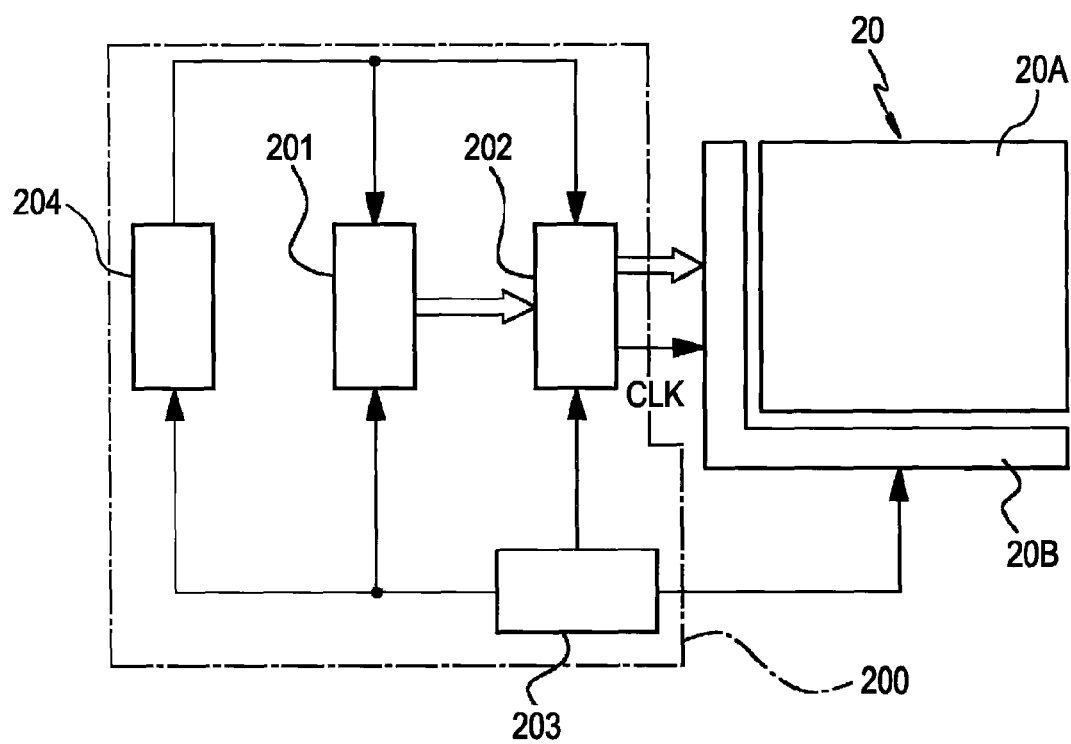
FIG. 21 is a block diagram of an electronic apparatus according to a third embodiment of the present invention.
Figure 22A:
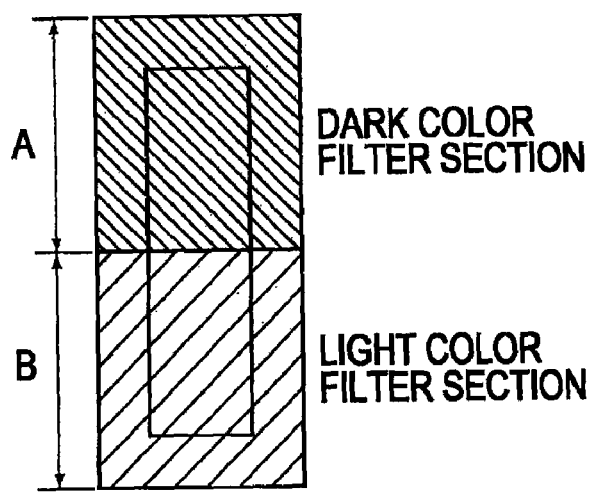
FIGS. 22A to 22C are illustrations of portions of a conventional color filter.
Figure 22B:
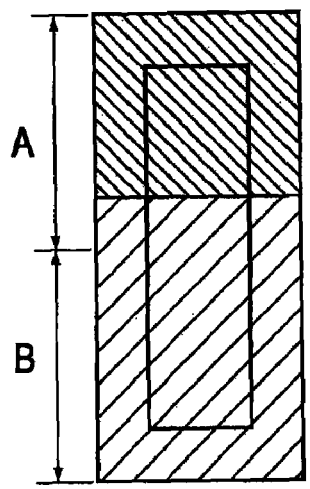
Figure 22C:
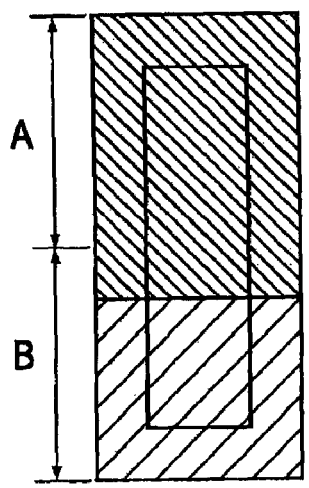

FIG. 21 schematically shows the electronic apparatus. With reference to FIG. 21, the electronic apparatus further includes a control unit 200 for controlling the electro-optical device. The electro-optical device includes a liquid crystal display panel 20 that includes a panel structure 20a and a driving circuit 20b including a semiconductor chip (an IC chip) and the like. The control unit 200 includes a display information output source 201, a display information-processing circuit 202, a power supply circuit 203, and a timing generator 204.

The display information output source 201 includes a memory unit including a read-only memory (ROM) and/or a random access memory (RAM), a storage unit including a magnetic recording disk and/or an optical recording disk, and a tuning circuit for tuning and outputting digital image signals and supplies image information to the display information-processing circuit 202 in the form of image signals having a predetermined format on the basis of various clock signals CLK generated by the timing generator 204.

The display information-processing circuit 202 includes known various sub-circuits such as a serial/parallel conversion sub-circuit, a amplification/inversion sub-circuit, a rotation sub-circuit, gamma-correction sub-circuit, and a clamp circuit; processes input display information; and supplies image information to the driving circuit 20*b* together with the clock signals CLK. The driving circuit 20*b* preferably includes a first electrode-driving sub-circuit, a second electrode-driving sub-circuit, and an inspection sub-circuit. The power supply circuit 203 has a function of supplying predetermined voltages to the above components.

The electronic apparatus includes the electro-optical device, in which color layers, made of color resists, having different color hues are arranged in at least one of subpixel regions forming each pixel so as not to overlap with each other in plan view such that light having a desired color hue is emitted from each subpixel region. Accordingly, the electronic apparatus can be manufactured at low cost and can reproduce a desired color.

INDUSTRIAL APPLICABILITY

The present invention provides an electro-optical device in which color layers having different color hues are arranged in at least one of subpixel regions forming each pixel so as not to overlap with each other in plan view and which can reproduce a desired color even if color resists are not prepared depending on the type of the electro-optical device. The electro-optical device can be used for various apparatuses such as liquid crystal apparatuses, display apparatuses, and electronic apparatuses. Examples of the electronic apparatuses include mobile phones; personal computers; liquid crystal televisions; viewfinder-type or direct view-type video tape recorders; car navigation systems; pagers; electronic notebooks; portable electronic calculators; word processors; work stations; video phones; point-of-sale (POS) terminals; electronic apparatuses having touch panels; displays, such as field emission displays (FEDs) and surface-conduction electron-emitter displays (SEDs), including electron emitters; plasma displays; organic electroluminescent apparatuses; and inorganic electroluminescent apparatuses.

What is claimed is:

1. An electro-optical device comprising:
    a plurality of subpixel regions forming a display field;
    each subpixel region including a reflective section and a transmissive section;
    each subpixel region including a color filter including a first color layer having a first primary color hue selected from the group consisting of red, green, and blue formed in both the reflective section and the transmissive section; and
    each subpixel region including second and third color layers that do not overlap the first color layer in plan view, the second and third color layers each having a second and third primary color hue selected from the group consisting of red, green, and blue,
    wherein the second primary color layer is formed in the reflective section and the third primary color layer is formed in the transmissive section,
    the second and third primary color hues each being different from the first primary color hue, and
    the second and third primary colors being different from each other.

2. The electro-optical device according to claim 1, wherein at least one of the subpixel regions has an uncolored zone.

3. The electro-optical device according to claim 1, wherein a thickness of the color layers in the transmissive section is greater than a thickness of the color layers in the reflective section.

4. The electro-optical device according to claim 1, wherein a plurality of second color layers are formed in the transmissive section and a plurality of third color layers are formed in the reflective section.

5. An electronic apparatus including the electro-optical device according to claim 1.

* * * * *